United States Patent [19]

Kerber et al.

[11] 4,004,220

[45] Jan. 18, 1977

[54] ELECTRONIC VOLTMETER

[75] Inventors: Marvin Clarence Kerber; William Steven Traver, both of Colchester, Ill.

[73] Assignee: Pulse Dynamics Corporation, Colchester, Ill.

[22] Filed: July 8, 1975

[21] Appl. No.: 594,183

[52] U.S. Cl. .............................. 324/103 P; 324/96; 324/122
[51] Int. Cl.$^2$ ................. G01R 19/16; G01R 13/02
[58] Field of Search ....... 324/103 P, 103 R, 121 R, 324/96, 122

[56] References Cited

UNITED STATES PATENTS

| | | | |
|---|---|---|---|
| 2,486,890 | 11/1949 | Stanmyre | 324/103 R |
| 2,884,085 | 4/1959 | von Wittern et al. | 324/103 R |
| 3,383,594 | 5/1968 | Fiorletta et al. | 324/121 R |
| 3,818,495 | 6/1974 | Sagara et al. | 324/96 |

Primary Examiner—Palmer C. Demeo
Assistant Examiner—Ernest F. Karlsen
Attorney, Agent, or Firm—Reising, Ethington, Barnard, Perry & Brooks

[57] ABSTRACT

This electronic voltmeter is particularly suited to develop volume unit output readings for appliance type electronic equipment. Seven operational amplifiers are used to selectively and separately energize seven light emitting diodes. Each of the operational amplifiers is provided a reference voltage. Additionally, each operational amplifier is supplied a voltage proportional to the peak voltage of the signal from the electronic equipment. The reference voltage and the voltage proportional to the peak signal from the equipment are compared by each operational amplifier. The operational amplifiers are sequentially switched as the level of the peak signal from the equipment increases. Six of the seven light emitting diodes are energized through transistors. The transistors coact with the operational amplifiers to extinguish all but one light emitting diode. Accordingly, only a single light emitting diode is energized at any time.

1 Claim, 1 Drawing Figure

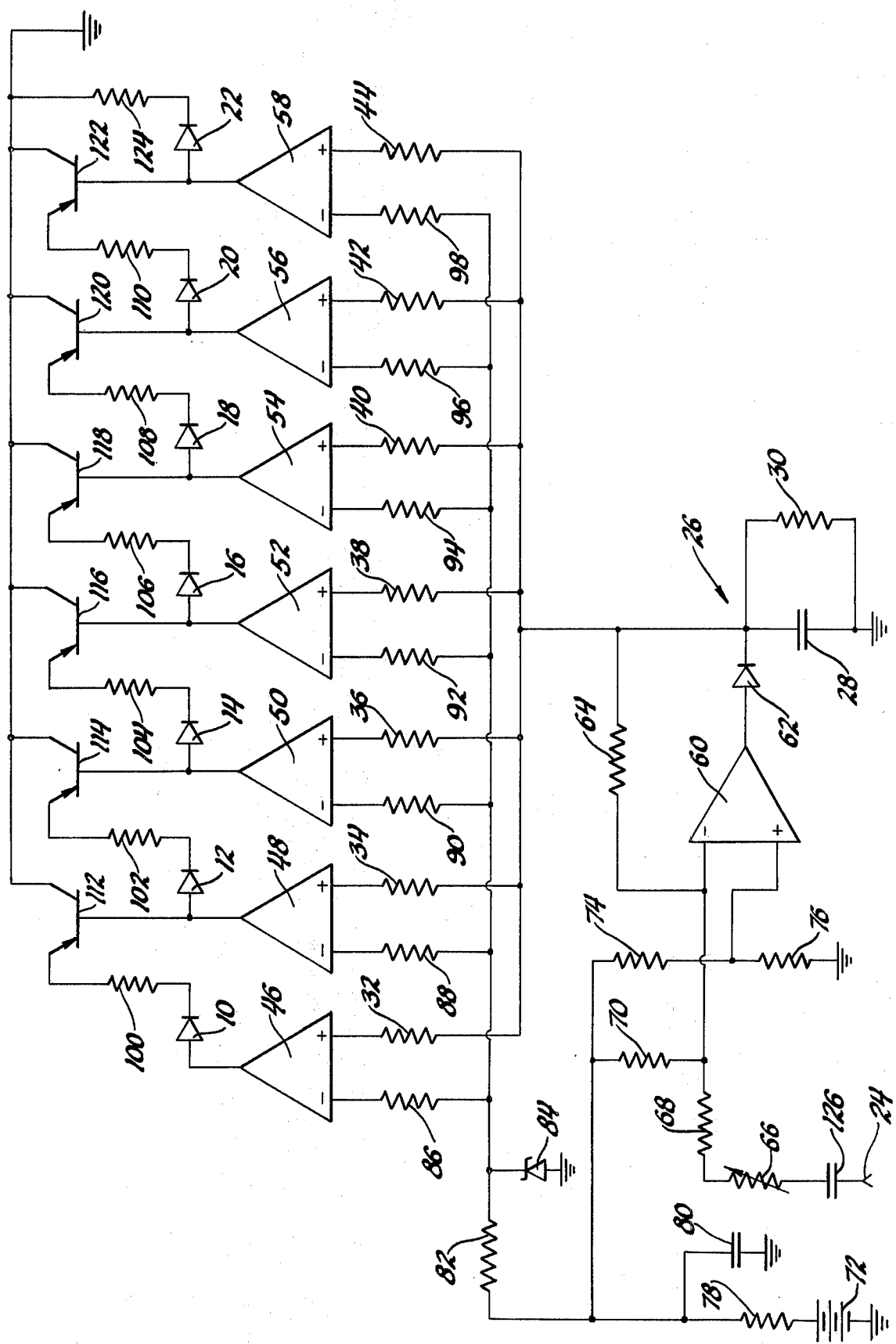

ELECTRONIC VOLTMETER

BACKGROUND OF THE INVENTION

1. Field of the Invention

This invention relates to electronic voltmeters.

2. Description of the Prior Art

Numerous electronic voltmeters are known to the prior art. These electronic voltmeters include digital readouts as well as calibrated light readouts. One form of electronic voltmeter using a calibrated light readout is illustrated in the U.S. Pat. No. 3,796,951 to Joseph. Joseph uses a series of light emitting diodes as readouts. U.S. Pat. No. 3,619,574 in the name of Mindheim, U.S. Pat. No. 3,754,121 in the name of Delay, et al, and U.S. Pat. No. 3,825,827 in the name of Tumbush also disclose electronic voltmeters with digital readouts.

The electronic voltmeter of the present invention is particularly suited for use with appliance type electronic equipment, particularly radio receivers, tape recorders, and other audio electronics. In the past, volume unit measurements for such equipment have been made using conventional electromechanical devices such as meters with permanent magnet moving coils, or iron vane movements, or electrostatic movements, and electrodynamometers. Recently, direct digital numerical readouts have also been used to indicate volume unit levels for such equipment.

The prior art approaches to monitoring volume units have several deficiencies. First, mechanical meters monitoring fluctuating signals must be read on the move, and digital readouts indicating fluctuating signals tend to blur several digits. Second, short duration signals are particularly difficult to track using prior art meters. For mechanical meters, response is limited by inertia; for digital readouts, by display time. Furthermore, the conventional mechanical monitor has wear points and is difficult to read at a distance.

SUMMARY OF THE INVENTION

Using the present invention, volume unit readings are electronically displayed by a series of light sources. The seven light sources of the preferred embodiment are independently energized. A given light source is energized if, but only if, the input signal is within an associated, predetermined range. The resulting visual readout is easily discerned, responsive to short duration input signals, and capable of tracking changing input signal levels.

The electronic voltmeter of this invention uses seven light emitting diodes as output visual indicators. Each diode is connected to an associated operational amplifier, and six of the seven diodes are connected through associated transistors with the next adjacent operational amplifier. The operational amplifiers are supplied two voltage signals. Each operational amplifier is supplied a reference voltage signal, and each operational amplifier is supplied a voltage signal proportional to the peak level of the monitored voltage signal. The operational amplifiers compare these voltage signals, switching their respective outputs in response to a reversal in the relative amplitudes of these voltage signals at their respective input terminal. The operational amplifiers coact with the transistors to energize only one light emitting diode at a time. The particular diode which is energized is determined by, and indicates, the strength of the monitored signal.

BRIEF DESCRIPTION OF THE DRAWINGS

The instant invention can be best understood by reference to the following description of a preferred embodiment taken in connection with the accompanying single FIGURE schematic of the present invention.

DESCRIPTION OF THE PREFERRED EMBODIMENT

Reference should now be made to the accompanying single FIGURE drawing wherein the electronic voltmeter of the present invention is shown schematically. Seven light emitting diodes 10, 12, 14, 16, 18, 20, and 22 are sequentially and separately energized in response to the level of an input signal applied to the input terminal 24. In the preferred embodiment, each of the seven light emitting diodes is illuminated only when the signal at the input 24 is within a predetermined range calibrated in volume units. The following table sets forth the range of volume units during which each light emitting diode is illuminated.

| LIGHT EMITTING DIODE | VOLUME UNIT RANGE DURING ILLUMINATION |
|---|---|
| 10 | −15 to −12 |
| 12 | −12 to − 9 |
| 14 | − 9 to − 6 |
| 16 | − 6 to − 3 |
| 18 | − 3 to 0 |
| 20 | 0 to 3 |
| 22 | 3 and Up |

A peak detector generally designated 26 develops a signal across a capacitor 28 in correlation with the peak value of the signal at the input 24. It should be understood that the maximum signal value which can be developed across capacitor 28 is limited by supply voltage and saturation characteristics of operational amplifier 60. This allows the signal at input 24 to greatly exceed the 3 volume unit level without circuit damage. The capacitor 28 has a discharge path through each of the resistors 30, 32, 34, 36, 38, 40, 42, and 44. The resistors 32, 34, 36, 38, 40, 42, and 44, in addition to their effect on the discharge time constant of the capacitor 28, serve to connect the instantaneous voltage across the capacitor 28 to the seven current activated electronic switches comprising operational amplifiers 46, 48, 50, 52, 54, 56, and 58.

The capacitor 28 is charged by an operational amplifier 60 through detector diode 62, which are also part of the peak detector 26. A feedback resistor 64 interconnects the output of the operational amplifier 60 with first input of the operational amplifier. The signal at the input 24 to the electronic voltmeter is connected to the first input of the operational amplifier 60 through resistors 66 and 68. The ratio of resistor 64 to the sum of resistors 66 and 68 controls the overall gain of peak detector 26 in accordance with traditional operational amplifier theory. Resistor 66 is made variable to provide a calibration control. Resistor 70 serves as a bias network for the supply of current from a direct voltage source 72 to the first input of the operational amplifier 60. A pair of resistors 74 and 76 are connected with the direct voltage source 72 to provide bias to the second input of the operational amplifier 60.

A resistor 78 and a capacitor 80 are connected between the bias resistors noted above and the direct voltage source 72. The resistor 78 and capacitor 80 form a decoupling circuit to eliminate switching transients from the supply line.

Voltage from the direct voltage source 72 is also supplied through a resistor 82 to a Zener diode 84. The Zener diode 84 sets a constant voltage for application through resistors 86, 88, 90, 92, 94, 96, and 98 respectively to operational amplifiers 46, 48, 50, 52, 54, 56, and 58 at a first input to each operational amplifier. It should be appreciated that the first input of each of the seven operational amplifiers is provided a reference current controlled by the operation of the Zener diode 84 and the value of resistors 86 through 98. In the preferred embodiment, all of the resistors 86 through 98 are of equal value, and the current at the first input of each operational amplifier is, therefore, identical to the current at the first input of each other operational amplifier. The resistors 32 through 44 are not of equal value, and the current at the second input of the operational amplifiers is, therefore, different from operational amplifier to operational amplifier.

The light emitting diodes 10 through 20 are connected respectively through resistors 100, 102, 104, 106, 108, and 110 to the emitters of transistors 112, 114, 116, 118, 120, and 122. The light emitting diode 22 is connected through a resistor 124 to ground. The collectors of all the transistors 112 through 122 are connected directly to ground. The base terminal of transistor 112 is connected to the input of operational amplifier 48. The base terminal of transistor 114 is connected to the output of operational amplifier 50. The base terminal of transistor 116 is connected to the output of operational amplifier 52. The base terminal of transistor 118 is connected to the output of operational amplifier 54. The base terminal of transistor 120 is connected to the output of operational amplifier 56. The base terminal of transistor 122 is connected to the output of operational amplifier 58.

In the present invention, operational amplifiers 46 through 58 are used as current controlled electronic switches. For each operational amplifier, the output has a near zero value set by the reference current at the first input and characteristics of the operational amplifier unless and until the current at the second input of the operational amplifier is greater than the current at the first input of the operational amplifier. If, but only if, the current at the second input is greater than the current at the first input, the output of the operational amplifier is a positive voltage set by the saturation characteristics of the operational amplifier. Practical operational amplifiers are not two state devices of this type. There is necessarily a transition curve between the near zero value and the positive saturation condition for the device. The transition effects are of no great significance to the present invention, and are accordingly intentionally ignored.

The operation of the circuitry of the schematic will now be explained.

As noted above, the current to the first input of each operational amplifier is set by the Zener diode 84 and equal valued resistors 86, 88, 90, 92, 94, 96 and 98. The current at the first input to each operational amplifier is equal to the current to the first input of all other operational amplifiers.

The current at the second input of each operational amplifier is controlled by the associated resistor from the group of resistors 32 through 44 and the voltage across the capacitor 28. The resistors 32 through 44 ascend in resistance, resistor 32 having the smallest and resistor 44 having the largest resistance. It should be understood that as the voltage across capacitor 28 increases, the current at the second input to operational amplifier 46 will exceed the current at the first input of that operational amplifier before the currents to the second inputs of the other operational amplifiers exceed the fixed current to the first inputs of those operational amplifiers. Further, the current at the second input to the operational amplifier 48 will exceed the current to the first input of that operational amplifier before the current to the second inputs of operational amplifiers 50 through 58 exceed the current to the first inputs of those operational amplifiers. Accordingly, it is apparent that the outputs from the operational amplifiers 46 through 58 sequentially switch, seriatim, from zero to positive as the voltage across the capacitor 28 increases. First, the operational amplifier 46 switches, then the operational amplifier 48, then the operational amplifier 50, then the operational amplifier 52, then the operational amplifier 54, then the operational amplifier 56, and finally the operational amplifier 58.

When the output of the operational amplifier 46 switches from zero to positive, the transistor 112 is biased on since its base is connected to the zero voltage from the operational amplifier 48 and its emitter is connected to the positive voltage from the operational amplifier 46. Under this condition, the light emitting diode 10 is energized and illuminated. The light emitting diodes 12 through 22 remain unenergized and unilluminated.

As the voltage across the capacitor 28 increases, the current to the second input of each operational amplifier likewise increases. The next operational amplifier to switch is the operational amplifier 48. When the operational amplifier 48 switches its output from zero to positive, the transistor 112 is forced into nonconduction. Simultaneously, however, the transistor 114 is biased to its conductive state. Accordingly, at this time the light emitting diode 10 is extinguished, and the light emitting diode 12 is energized.

The sequential switching of the outputs of operational amplifiers 50, 52, 54, and 56 in response to increasing voltage across the capacitor 28 likewise energizes and illuminates, sequentially and separately, the light emitting diodes 14, 16, 18, and 20. It should be appreciated that one, and only one, light emitting diode is energized and illuminated at any time.

At the time the output from operational amplifier 58 switches, it is effective to extinguish the light emitting diode 20. Also, it is effective to energize and illuminate the light emitting diode 22. However, it should be noted that there is no transistor to extinguish the light emitting diode 22 if the voltage across the capacitor 28 continues to increase. Accordingly the light emitting diode 22 is illuminated and energized, as shown in the table above, for all voltage levels in excess of the predetermined minimum.

A capacitor 126 blocks direct voltage signals at the input 24. Thus, it should be appreciated, the input to the peak detector 26 does not include any direct voltage component that might be present from the electronic equipment being monitored.

In the preferred embodiment, the illustrated circuit elements were selected as follows:
  the light emitting diodes 10, 12, 14, 16, 18, 20, and 22 are Hewlett-Packard 5082-4850 diodes;
  the capacitor 28 has a capacitance of 10 mfd;

the resistor 30 has a resistance of 47 k;
the resistor 32 has a resistance of 200 k;
the resistor 34 has a resistance of 360 k;
the resistor 36 has a resistance of 620 k;
the resistor 38 has a resistance of 910 k;
the resistor 40 has a resistance of 1.3 m;
the resistor 42 has a resistance of 2.0 m;
the resistor 44 has a resistance of 2.7 m;
the operational amplifiers 46, 48, 50, and 52 are contained in one National Semiconductor LM 3900 N integrated circuit package and the operational amplifiers 25, 54, 56, 58, and 60 are contained in a second LM 3900 N package;
the diode 62 is a Fairchild Semiconductor 1 N 914 diode;
the resistor 64 has a resistance of 470 k;
the resistor 66 has a resistance of 25 k;
the resistor 68 has a resistance of 68 k;
the resistor 70 has a resistance of 3.3 m;
the direct voltage source 72 is a 12 volt source;
the resistor 74 has a resistance of 3.3 m;
the resistor 76 has a resistance of 470 k;
the resistor 78 has a resistance of 10 ohms;
the capacitor 80 has a capacitance of 100 mfd;
the resistor 82 has a resistance of 1 k;
the Zener diode 84 is a Motorola 1N753A diode;
the resistors 86, 88, 90, 92, 94, 96, and 98 each have a resistance of 2.2 m;
the resistors 100, 102, 104, 106, 108, 110, and 124 each have a resistance of 1 k;
the transistors 112, 114, 116, 118, 120, and 122 are Fairchild Semiconductor 2 N 4248 transistors; and
the capacitor 126 has a capacitance of 0.68 mfd.

Although the foregoing has proceeded in terms of a particular preferred embodiment, it is to be understood that various changes and modifications could be engrafted thereon by one skilled in the art within the spirit and scope of the appended claims.

We claim:

1. An electronic voltmeter calibrated to develop volume unit output readings for appliance type electronic equipment comprising:
    means for developing a reference voltage level;
    means for detecting the peak voltage level of a monitored signal;
    a plurality of operational amplifiers, each of said operational amplifiers being connected to both said means for developing a reference voltage level and said means for detecting the peak voltage level of a monitored voltage signal, and each of said operational amplifiers being operative to develop a first voltage output when the voltage from said means for detecting the peak voltage level of a monitored voltage signal is greater than the voltage from said means for developing a reference voltage level and a second voltage output when the voltage from said means for detecting the peak voltage level of a monitored voltage signal is less than the voltage from said means for developing a reference voltage level;
    a plurality of light emitting diodes respectively connected to the outputs of said plurality of operational amplifiers; and
    a plurality of transistors connected with said light emitting diodes for selectively and separately energizing said light emitting diodes in response to the outputs of said operational amplifiers, each of said light emitting diodes being the sole energized light emitting diode when the monitored voltage is within an associated, predetermined range.

* * * * *